US006963257B2

(12) United States Patent
Ellä et al.

(10) Patent No.: US 6,963,257 B2
(45) Date of Patent: Nov. 8, 2005

(54) COUPLED BAW RESONATOR BASED DUPLEXERS

(75) Inventors: Juha Ellä, Halikko (FI); Robert Aigner, Unterhaching (DE)

(73) Assignees: Nokia Corporation, Espoo (FI); Infineon Technologies AG, Munich (DE)

(*) Notice: Subject to any disclaimer, the term of this patent is extended or adjusted under 35 U.S.C. 154(b) by 19 days.

(21) Appl. No.: 10/804,830

(22) Filed: Mar. 19, 2004

(65) Prior Publication Data

US 2005/0206476 A1 Sep. 22, 2005

(51) Int. Cl.[7] .......................... H03H 9/70; H03H 9/54; H03H 9/60

(52) U.S. Cl. ..................... 333/133; 333/189; 333/192; 310/335; 310/366

(58) Field of Search .............................. 333/186–192, 333/133; 310/335, 366

(56) References Cited

U.S. PATENT DOCUMENTS

| | | | | |
|---|---|---|---|---|
| 5,382,930 A * | 1/1995 | Stokes et al. | ............... | 333/191 |
| 5,561,406 A * | 10/1996 | Ikata et al. | ................. | 333/126 |
| 5,789,845 A * | 8/1998 | Wadaka et al. | ............. | 310/334 |
| 5,864,261 A * | 1/1999 | Weber | ........................ | 333/187 |
| 5,910,756 A * | 6/1999 | Ella | ........................... | 333/133 |
| 6,081,171 A | 6/2000 | Ellä et al. | .................. | 333/189 |
| 6,262,637 B1 * | 7/2001 | Bradley et al. | ............. | 333/133 |
| 6,373,350 B1 * | 4/2002 | Fujita | ......................... | 333/133 |
| 6,670,866 B2 | 12/2003 | Ellä et al. | .................. | 333/133 |
| 6,714,099 B2 * | 3/2004 | Hikita et al. | ................ | 333/133 |
| 6,720,844 B1 * | 4/2004 | Lakin | ........................ | 333/189 |

OTHER PUBLICATIONS

IEEE 2001 Ultrasonics Symposium Paper 3E-6; K.M. Lakin et al.; "High Performance Stacked Crystal Filters for GPS and Wide Bandwidth Applications"; pp. 1-6; Oct. 9, 2001.

* cited by examiner

*Primary Examiner*—Barbara Summons
(74) *Attorney, Agent, or Firm*—Ware, Fressola, Van Der Sluys & Adolphson

(57) ABSTRACT

A duplexer comprising a transmit resonator device and a receive resonator device for filtering transmit and receive signals. The resonator device has a first BAW resonator for generating an acoustic wave signal from an input electric signal, a first acoustic delay for delaying the acoustic wave signal, and an intermediate BAW resonator for receiving the delayed acoustic wave signal at one end and converting the delayed acoustic wave signal to an electric signal. Through electrical coupling, the electric signal also appears at another end of the intermediate BAW resonator for generating a further acoustic wave signal at the other end. The resonator further comprises a second delay for delaying the further acoustic wave signal, and a second BAW resonator for producing an output electric signal from the delayed further acoustic wave signal. The duplexer can be used in a transceiver in a mobile phone.

26 Claims, 13 Drawing Sheets

(a)

(b)

(c)

(d)

COUPLED BAW RESONATOR BASED DUPLEXERS

NAMES OF PARTIES TO A JOINT RESEARCH AGREEMENT

The invention claimed herein was made by or on behalf of Nokia Corporation AND Infineon Technologies AG who are parties to a joint research agreement signed on Jan. 25, 2002 as an extension of a cooperation agreement concerning bulk acoustic wave receiver and transmitter filters.

FIELD OF THE INVENTION

The present invention relates generally to bulk acoustic wave resonators and filters and, more particularly, to bulk acoustic wave baluns used in filters and duplexers.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). An SCF usually has two or more piezoelectric layers and three or more electrodes, with some electrodes being grounded. The difference between these two types of devices lies mainly in their structure. FBARs are usually used in combination to produce passband or stopband filters. The combination of one series FBAR and one parallel, or shunt, FBAR makes up one section of the so-called ladder filter. The description of ladder filters can be found, for example, in Ella (U.S. Pat. No. 6,081,171, hereafter referred to as Ella '171). As disclosed in Ella '171, an FBAR-based device may have one or more protective layers commonly referred to as the passivation layers. A typical FBAR-based device is shown in FIGS. 1*a* to 1*d*. As shown in FIGS. 1*a* to 1*d*, the FBAR device comprises a substrate 501, a bottom electrode 507, a piezoelectric layer 509, and a top electrode 511. The electrodes and the piezoelectric layer form an acoustic resonator. The FBAR device may additionally include a membrane layer 505. As shown in FIG. 1*a*, an etched hole 503 is made on the substrate 501 to provide an air interface, separating the resonator from the substrate 501. Alternatively, an etched pit 502 is provided on the substrate 501, as shown in FIG. 1*b*. It is also possible to provide a sacrificial layer 506 separating the resonator and the substrate, as shown in FIG. 1*c*. It is also possible to form an acoustic mirror 521 between the bottom electrode 507 and the substrate 501 for reflecting the acoustic wave back to the resonator, as shown in FIG. 1*d*. The substrate can be made from silicon (Si), silicon dioxide (SiO2), Gallium Arsenide (GaAs), glass or ceramic materials. The bottom electrode and top electrode can be made from gold (Au), molybdenum (Mo), tungsten (W), copper (Cu), nickel (Ni), titanium (Ti), Niobium (Nb), silver (Ag), tantalum (Ta), cobalt (Co), aluminum (Al) or a combination of these metals, such as tungsten and aluminum. The piezoelectric layer 130 can be made from zinc oxide (ZnO), zinc sulfide (ZnS), aluminum nitride (AlN), lithium tantalate (LiTaO3) or other members of the so-called lead lanthanum zirconate titanate family. Additionally, a passivation layer typically made from a dielectric material, such as SiO2, Si3N4, or polyimide, is used to serve as an electrical insulator and to protect the piezoelectric layer. It should be noted that the sacrificial layer 506 in a bridge-type BAW device, as shown in FIG. 1*c*, is, in general, etched away in the final fabrication stages to create an air interface beneath the device. In a mirror-type BAW device, as shown in FIG. 1*d*, the acoustic mirror 521 consists of several layer pairs of high and low acoustic impedance materials, usually a quarter-wave thick. The bridge-type and the mirror-type BAW devices are known in the art.

It is also known in the art that FBARs can be used to form impedance element filters in a ladder filter configuration that has unbalanced input and output ports, or in a lattice filter configuration that has balanced ports. In some applications it would be advantageous to transform an unbalanced input to a balanced output (or vice versa) within a filter. Such filters have been produced using acoustically coupled surface acoustic wave (SAW) resonators. Basically these structures are based on a pair of resonators, as shown in FIG. 2. As shown, the first resonator 620 generates the acoustic wave and the second resonator 630 acts as a receiver. Since the resonators are not electrically connected, one of them can be connected as an unbalanced device and the other can be used in either as a balanced or an unbalanced device. As shown in FIG. 2, the first resonator 620 provides an unbalanced port 622 for signal input, whereas the second resonator 630 provides two ports 632, 634 for balanced signal outputs. As shown, numerals 610 and 640 denote reflectors or acoustic mirrors for the surface acoustic wave device. This same principle can be used in a BAW device having a structure that has two piezoelectric layers, one on top of each other. Using such a structure, it is possible to perform this unbalanced-to-balanced transformation. This structure can then be used as part of a filter or even a duplexer. One possible way of realizing such a structure is described in "High Performance Stacked Crystal Filters for GPS and Wide Bandwidth Applications", K. M. Lakin, J. Belsick, J. F. McDonald, K. T. McCarron, IEEE 2001 Ultrasonics Symposium Paper 3E-6, Oct. 9, 2001 (hereafter referred to as Lakin). FIG. 3 is a coupled resonator filter (CRF) disclosed in Lakin. As shown in FIG. 3, the CRF is formed by a bottom electrode 507, a bottom piezoelectric layer 508, a cross-over electrode 511, a plurality of coupling layers 512, a ground electrode 513, a top piezoelectric layer 509 and two separate top electrodes 531 and 532. As such, the CRF has a first vertical pair 541 of resonators and a second vertical pair 542 of resonators. Each of the vertical pairs acts as a one-pole filter. In series, the two vertical pairs act as a two-pole filter. The CRF is made on a substrate 501 separated by an acoustic mirror 521.

Ella et al. (U.S. Pat. No. 6,670,866 B2, hereafter referred to as Ella '866) discloses a BAW device with two resonators and a dielectric layer therebetween. As shown in FIG. 4, the BAW device 20 is formed on a substrate 30 and comprises a first electrode 40, a first piezoelectric layer 42, a second electrode 44 connected to the device ground 12, a third electrode 60, a dielectric layer 50 between the second electrode 44 and the third electrode 60, a second piezoelectric layer 62 and a fourth electrode 64. The first electrode 40, the first piezoelectric layer 42 and the second electrode 44 have an overlapping area for forming a first resonator 92. The third electrode 60, the second piezoelectric layer 62 and the fourth electrode 64 have an overlapping area for forming a second resonator 94. The bulk acoustic wave device 20 has a resonant frequency and an acoustic wavelength, $\lambda$, characteristic of the resonant frequency. The thickness of the first and second piezoelectric layers 42, 62 is substantially equal to $\lambda/2$. Furthermore, the device 20 has an acoustic mirror 34 formed between the first electrode 40 and the substrate 30 to reflect acoustic waves back to the first resonator 92. As shown in FIG. 4, a section of the first electrode 40 is exposed for use as a connection point to the signal input end 14 of a balun 10 (see FIG. 5). Similarly, a section of the second electrode 44 is exposed for use as a connection point to the device ground 12. The first resonator 92 and the second resonator 94 have an overlapping area 70, defining an active area of the bulk acoustic wave device 20. The device 20 has a first signal output end 16 and a second signal output end 18.

Ella '886 also discloses a balun for use in applications with lower bandwidth requirements. As shown in FIG. 5, the balun 10 has two identical stacks 21, 21' of layers, similar to the bulk acoustic wave device 20 of FIG. 4. However, the first electrode 40' and the third electrode 60' of the layer stack 21', and the second electrode 44 and the third electrode 60 of the layer stack 20 are connected to ground 12. In addition, the second electrode 44' of the layer stack 21' is connected to the first electrode 40 of the layer stack 21 and is used as the signal input end 14. The top electrode 64 of the layer stack 21 is used as the first signal output end 16, while the top electrode 64' of the layer stack 21' is used as the second signal output end 18. With the double-structure, there is no need for the compensation capacitance because the electrodes 60, 60' below the upper piezoelectric layers 62, 62' are grounded. This electric shielding effect results in the symmetric impedance for the first and second signal output ends 16, 18. The parasitic capacitance of the dielectric layers 50, 50' is parallel to the signal input end 14. This parasitic capacitance somewhat degrades the bandwidth of the device but does not harm its symmetry. The cross-connected input electrodes 40, 44' generate a perfect 180° phase between the acoustic waves in the stack 21 and the stack 21'.

Ella '886 also discloses that the balun 10 can be used as part of a filter that has one unbalanced port and two balanced ports. Two baluns 10 can be coupled to lattice filters 150 to form a duplexer 201 as shown in FIG. 6. In FIG. 6, a phase shifter 242 is used for filter matching. Similarly, two baluns 10 can be coupled to one lattice filter 150 and one ladder filter 250 to form a duplexer 203, as shown in FIG. 7.

It is also possible to form a simple duplexer by using two single-ended ladder filters and a phase shifter, as shown in FIG. 8. As shown in the figure, a single-ended ladder filter 260 is used for Tx and another single-ended ladder filter 262 is used for Rx. However, it usually requires that some inductance components, such as coils, to be connected in series with some of the shunt resonators in the Tx filter order to shift the natural notch to coincide with the Rx frequency. These coils not only cause additional losses in the duplexer, but also create other higher resonance frequencies, further degrading the overall out-of-band attenuation of a single-ended filter. In order to reduce the out-of-band attenuation in the Rx path, it is possible to combine a fully balanced Rx filter with a single-ended Tx filter, as shown in FIG. 9. As shown in FIG. 9, the fully balanced Rx filters 270 are connected to a pair of connected (in series) baluns. The problem with this approach is that any loss associated with the baluns at the antenna port will also cause losses in the Tx path. The Tx path also suffers from the degraded out-of-band due to the inductance.

It is thus advantageous and desirable to provide a simple duplexer that does not have the above-mentioned disadvantageous.

SUMMARY OF THE INVENTION

The present invention uses a coupled resonator filter in the transmit path of a duplexer and another coupled resonator filter in the receive path. The coupled resonator filter in the transmit path has a single-ended input port and a single-ended output port, whereas the coupled resonator filter in the receive path has a single-to-balanced transformation.

Thus, the first aspect of the present invention provides a duplexer for use in a communication device, the communication device having an antenna for conveying communication signals;

a transmit path operatively connected to the antenna for transmitting the signals; and a receive path operatively connected to the antenna for receiving the signals. The duplexer comprises:

a first coupled resonator device disposed in the transmit path for filtering the signals in the transmit path;

a second coupled resonator device disposed in the receive path for filtering the signals in the receive path; and a phase shifter disposed in the receive path and operatively connected to the second coupled resonator device, wherein each of said first and second coupled resonator devices comprises:

an input end for receiving the signals in the corresponding path, and an output end for providing filtered signals in the corresponding path;

a first resonator operatively connected to the input end to provide acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing at the first and second ends electric signals indicative of the delayed acoustic wave signals for generating further acoustic wave signals at the second end;

a second delay section, responsive to the further acoustic wave signals, for providing further delayed acoustic wave signals; and a second resonator operatively connected to the output end, for providing the filtered signals to the output end responsive to the further delayed acoustic wave signals.

According to the present invention, the phase shifter is disposed between the second coupled resonator device and the antenna.

According to the present invention, the communication device may comprise a further phase shifter disposed in the transmit path and operatively connected to the first coupled resonator device, wherein the further phase shifter is disposed between the first coupled resonator device and the antenna.

Alternatively, the first coupled resonator device is disposed between the further phase shifter and the antenna.

According to the present invention, the input end of the first coupled resonator device comprises two input terminals, and the output end of the first coupled resonator device comprises two output terminals, and wherein one of the two input terminals and one of the two output terminals are operatively connected to ground.

According to the present invention, the input end of the second coupled resonator comprises two input terminals, and wherein one of the two input terminals is operatively connected to ground to achieve a single-to-balanced transformation.

According to the present invention, the first and second resonators are bulk acoustic wave devices. Each of the first and second delays comprises a transmission line or one or more lumped elements. These non-acoustic delays may be integrated into the coupled resonator devices.

The second aspect of the present invention provides a coupled resonator device, which comprises:

an input end for receiving the signals in the corresponding path, and an output end for providing filtered signals in the corresponding path;

a first resonator, operatively connected to the input end to provide acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing electric signals at the first and second ends indicative of the delayed acoustic wave signals for generating further acoustic wave signals at the second end;

a second delay section, responsive to the further acoustic wave signals, for providing further delayed acoustic wave signals; and a second resonator, operatively connected to the output end, for providing the filtered signals to the output end responsive to the further delayed acoustic wave signals.

According to the present invention, the resonator device has a substrate and the intermediate resonator comprises:

a first electrode disposed on the substrate;

a piezoelectric layer disposed on the first electrode; and a second electrode disposed on the piezoelectric layer, the second electrode having a first end and a second end, and wherein the first delay section is disposed on the first end of the second electrode;

the second delay section is disposed on the second end of the second electrode;

the first resonator is disposed on the first delay section; and the second resonator is disposed on the second delay section.

According to the present invention, each of the first and second resonators comprises a pair of electrodes and a further piezoelectric layer disposed between said pair of electrodes.

According to the present invention, the resonator device may have an acoustic mirror disposed adjacent to the intermediate resonator, between the first electrode and the substrate.

Each of the first and second delay sections comprises a plurality of dielectric materials, or a structure composed of silicon dioxide and tungsten layers.

According to the present invention, the input end comprises two input terminals, wherein one of the two input terminals is operatively connected to ground and the other input terminal is optionally connected to a phase shift component.

According to the present invention, the first resonator has a first resonant frequency, and the second resonator has a second resonant slightly different from the first resonant frequency.

The third aspect of the present invention provides a communication device, which comprises:

an antenna port for conveying communication signals;

a transceiver having a transmit port and a receive port; and a duplexer comprising:

a first coupled resonator device disposed in a transmit path between the antenna port and the transmit port for filtering the signals in the transmit path;

a second coupled resonator device disposed in the receive path between the antenna port and the receive port for filtering the signals in the receive path; and a phase shifter disposed in the receive path and operatively connected to the second coupled resonator device, wherein each of said first and second coupled resonator devices comprises:

an input end for receiving the signals in the corresponding path; and an output end for providing filtered signals in the corresponding path;

a first resonator, operatively connected to the input end, for providing acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing an electric signals at the first and second ends indicative of the delayed acoustic wave signals for generating further acoustic wave signals at the second end;

a second delay section, responsive to the further acoustic wave signals, for providing further delayed acoustic wave signals; and a second resonator operatively connected to the output end, for providing the filtered signals to the output end responsive to the further delayed acoustic wave signals.

According to the present invention, each of the phase shifter and the further phase shifter comprises a transmission line or a lumped element, which may be integrated into the resonator devices.

According to the present invention, the duplexer may include a further phase shifter disposed in the transmitted path and operatively connected to the first coupled resonator device.

According to the present invention, each of the phase shifter and the further phase shifter comprises a transmission line or a lump element, which may be integrated into the resonator devices.

The communication device can be a mobile terminal, a communicator device or the like.

The present invention will become apparent upon reading the description taken in conjunction with FIGS. 10–13.

BEST MODE TO CARRY OUT THE PRESENT INVENTION

Figure 1:
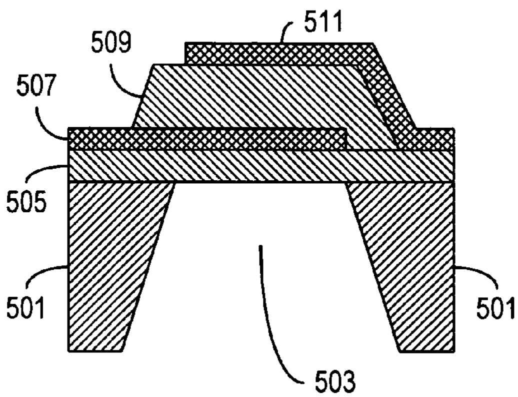
FIG. 1*a* is a cross-sectional view illustrating a typical bulk acoustic wave device having a resonator and a membrane formed on a substrate, wherein the substrate has a through hole for providing an air interface for the membrane.
FIG. 1*b* is a cross-sectional view illustrating a typical bulk acoustic wave device having a resonator and a membrane formed on a substrate, wherein the substrate has an etched section for providing an air interface for the membrane.
FIG. 1*c* is a cross-sectional view illustrating a typical bulk acoustic wave device having a resonator and a membrane formed on a substrate, wherein a sacrificial layer is formed between the membrane and the substrate.
FIG. 1*d* is a cross-sectional view illustrating a typical bulk acoustic wave device having a resonator formed on a substrate, wherein an acoustic mirror is formed between the substrate and the bottom electrode of the resonator.
Figure 1:
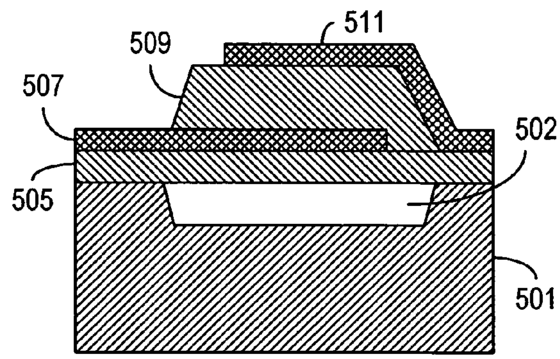
Figure 1:
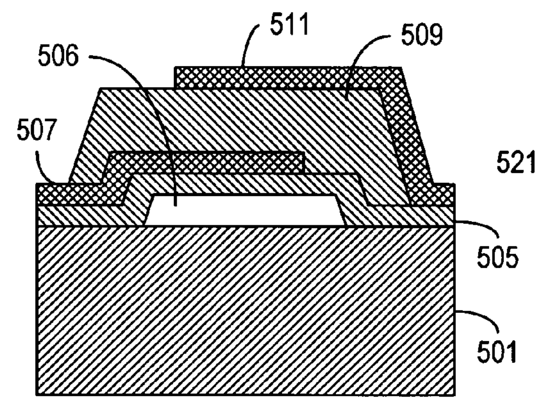
Figure 1:
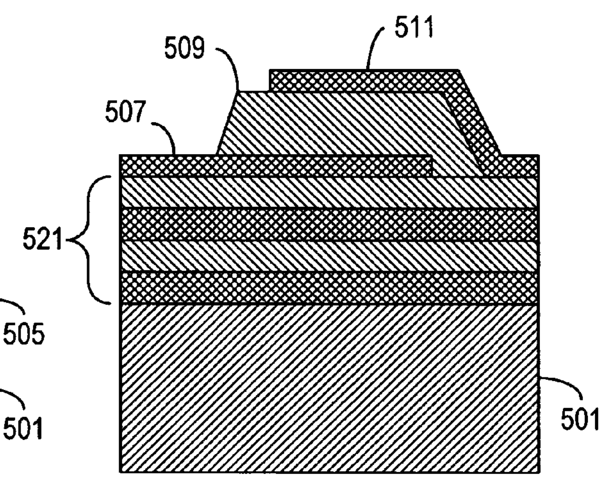
Figure 2:
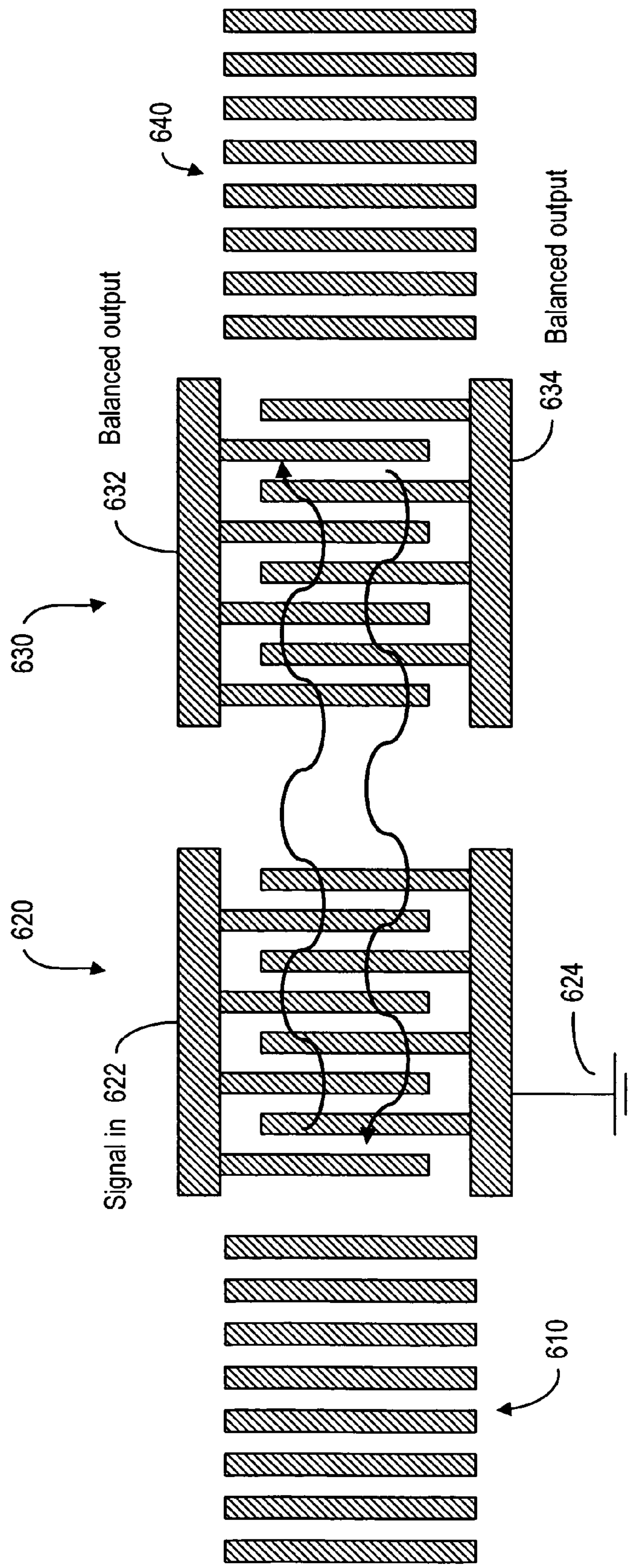
FIG. 2 is a schematic representation showing a prior art arrangement, wherein two resonators are used to transform unbalanced signals to balanced signals.
Figure 3:
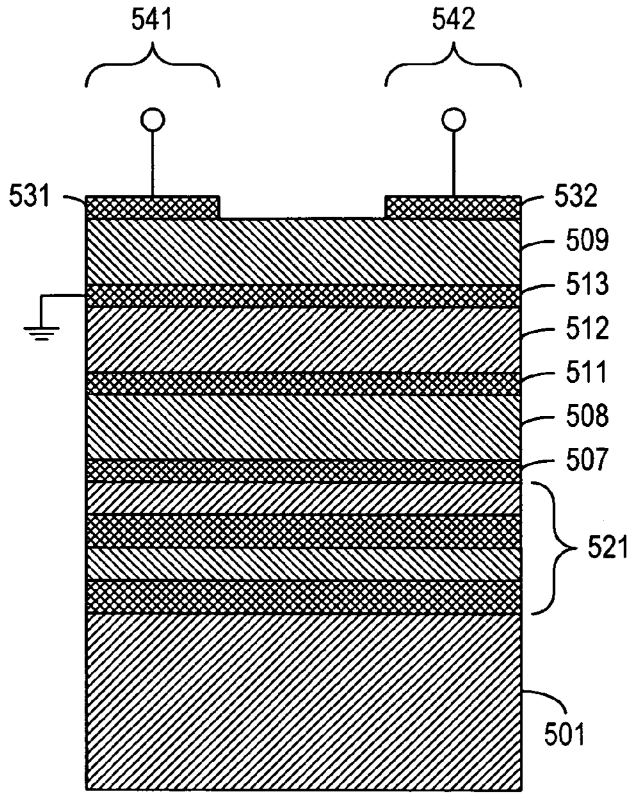
FIG. 3 is a cross sectional view illustrating a prior art arrangement of a coupled resonator filter, wherein two crystal filter resonators are horizontally spaced.
Figure 5:
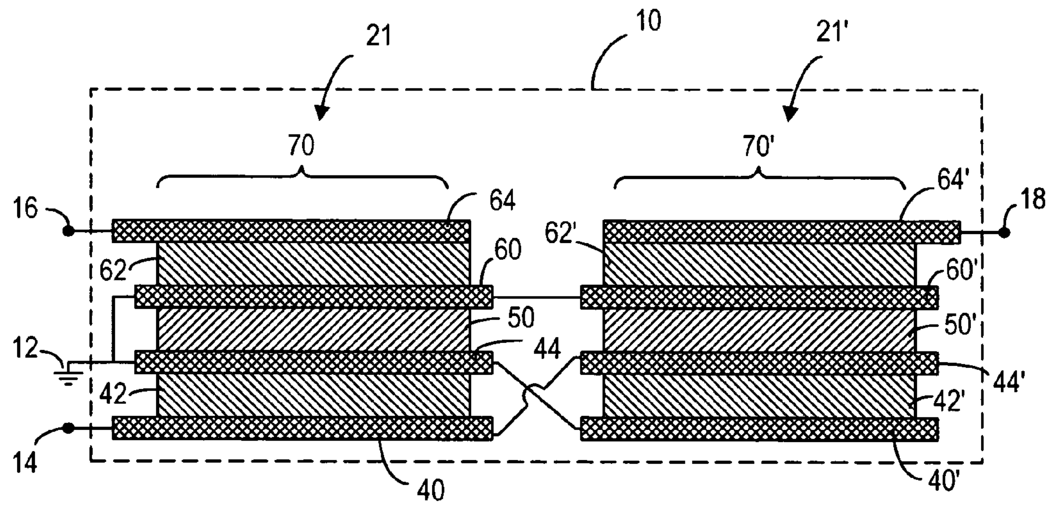
FIG. 5 is a schematic representation showing a prior art balun with two filter stacks.
Figure 4:
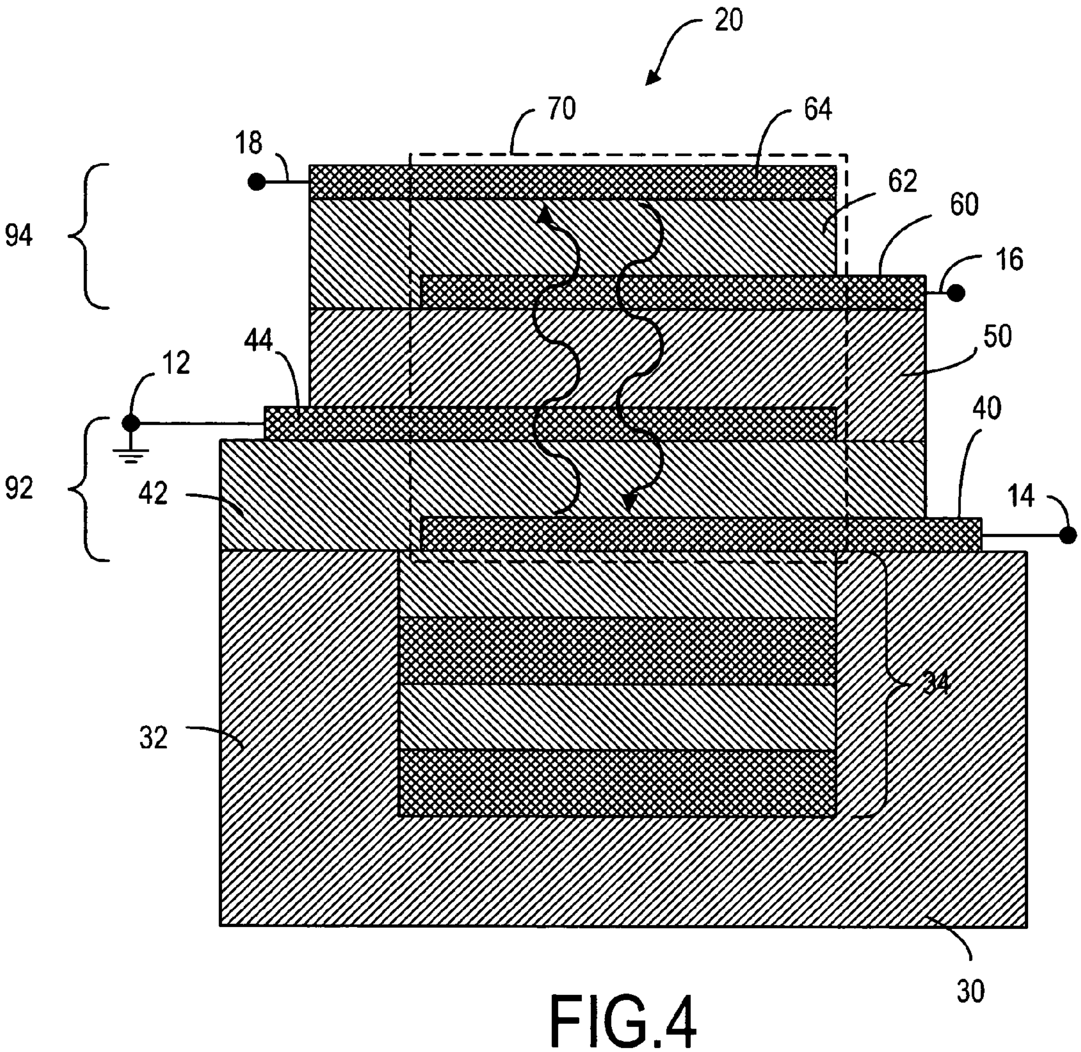
FIG. 4 is a schematic representation showing a prior art balun with one signal input port and two signal output ports.
Figure 10:
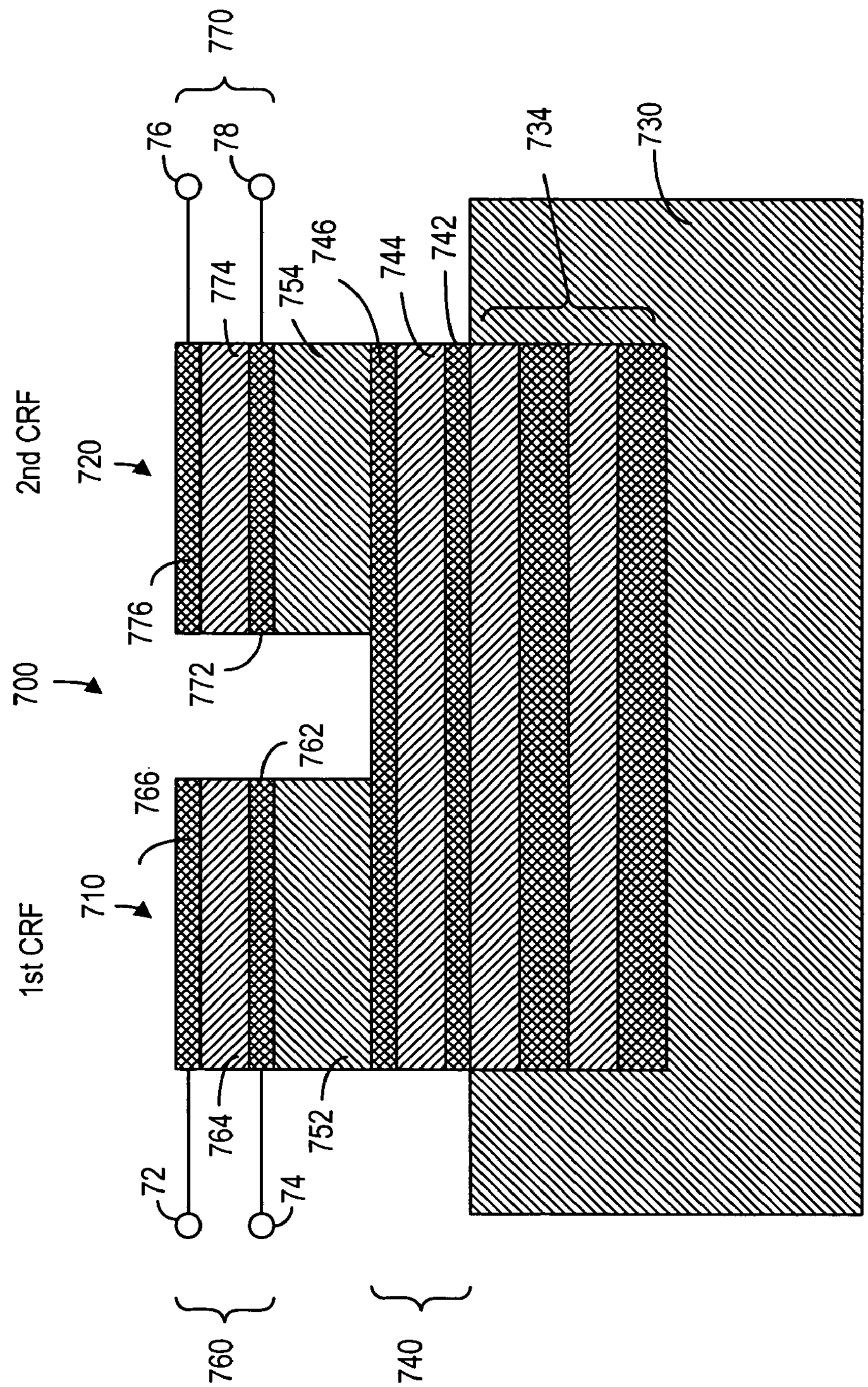
FIG. 10 is a schematic representation showing the coupled BAW resonator, according to the present invention.
Figure 11:
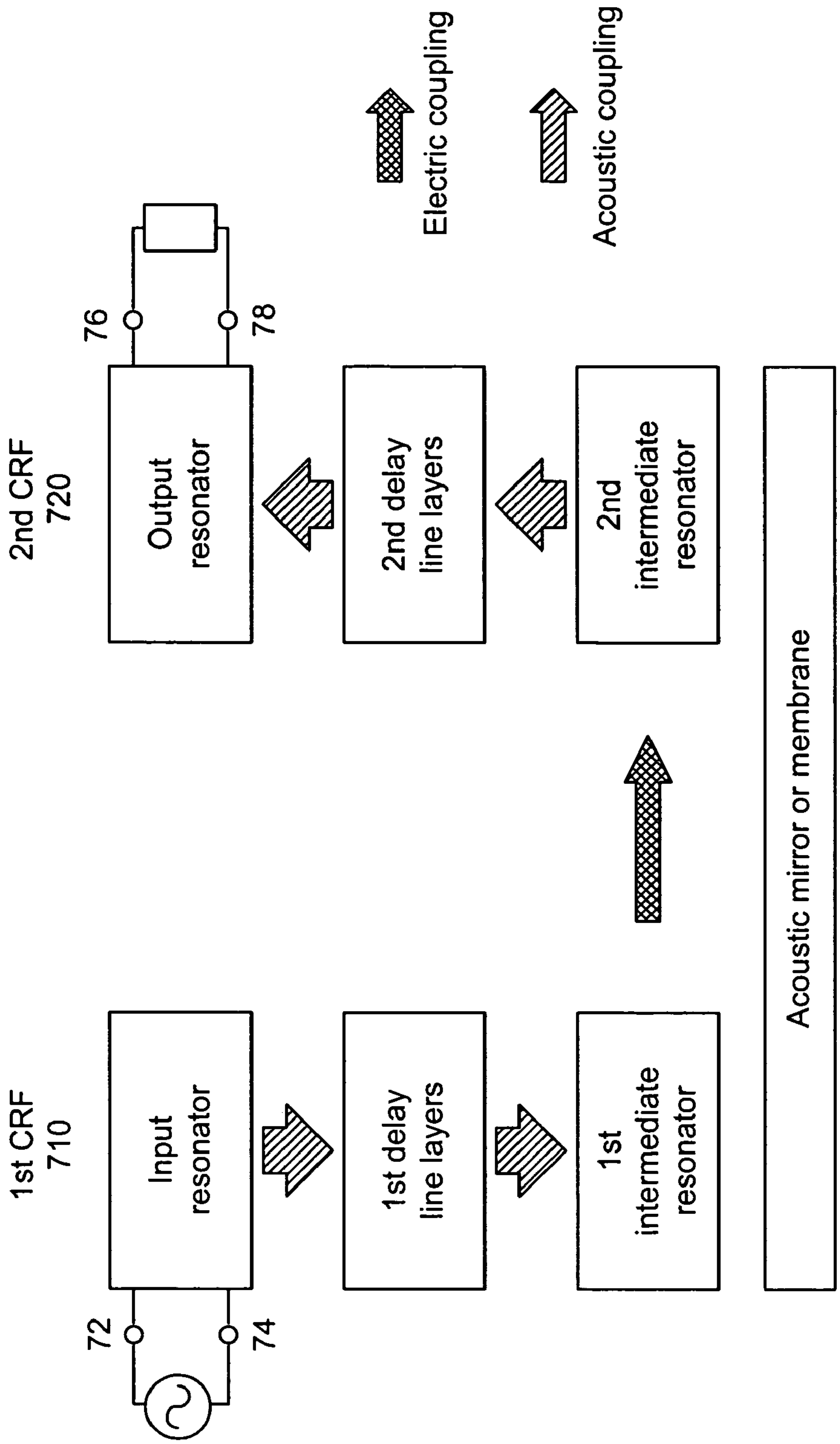
FIG. 11 is a block diagram illustrating the acoustic and electrical coupling in the coupled BAW resonator.

The duplexer, according to the present invention, is based on coupled BAW resonator devices. The coupled resonator device is shown in FIG. 10. The coupled resonator device 700 comprises a coupled resonator filter (CRF) 710 coupled to another CRF 720. As shown in FIG. 10, the resonator device 700 comprises a substrate 730, a lower resonator 740, a first delay 752, a second delay 754, a first upper resonator 760 and a second upper resonator 770. The lower resonator 740 comprises a bottom electrode 742, an upper electrode 746 and a piezoelectric layer 744 disposed between the electrodes 742 and 746. The first delay 752 and the second delay 754, which are separately disposed on top of the lower resonator 740, are composed of a plurality of layers of different dielectric materials. The structure of the first delay 752 and the second delay 754 can be $SiO_2/W/SiO_2$, for example. The first upper resonator 760, which is disposed on top of the first delay 752, comprises a bottom electrode 762, an upper electrode 766 and a piezoelectric layer 764 therebetween. The second upper resonator 770, which is disposed on top of the first delay 754, comprises a bottom electrode 772, an upper electrode 776 and a piezoelectric layer 774 therebetween. The resonator device 700 may comprise an acoustically reflecting membrane with a cavity (see FIG. 1*a*), a sacrificial layer (see FIG. 1*c*), or an acoustic mirror 734 under the lower resonator 740. One of the upper resonators is used as a signal input port and the other is used as a signal output port. As shown in FIG. 10, the electrodes 766, 762 are connected to terminals 72 and 74; and the electrodes 776, 772 are connected to terminals 76 and 78. If first upper resonator 760 is used to excite an acoustic wave by an electric signal through terminals 72, 74, the acoustic wave propagates to the lower resonator 740 through the first delay 752. At the lower resonator 740, the acoustic wave in the piezoelectric layer 744 is converted into electrical signal. The electrical signal in the electrodes 742, 746 is again converted into an acoustic wave, which propagates to the second upper resonator 770 through the second delay 754. At the resonator 770, the acoustic wave is converted back to an electric signal at the terminals 76, 78. The acoustic excitation within the CRF 710 and CRF 720, and electrical coupling between them is shown in FIG. 11. The first upper resonator 760 and the second upper resonator 770 typically exhibit slightly different resonant frequencies in order to shape the passband response.

Figure 12A:
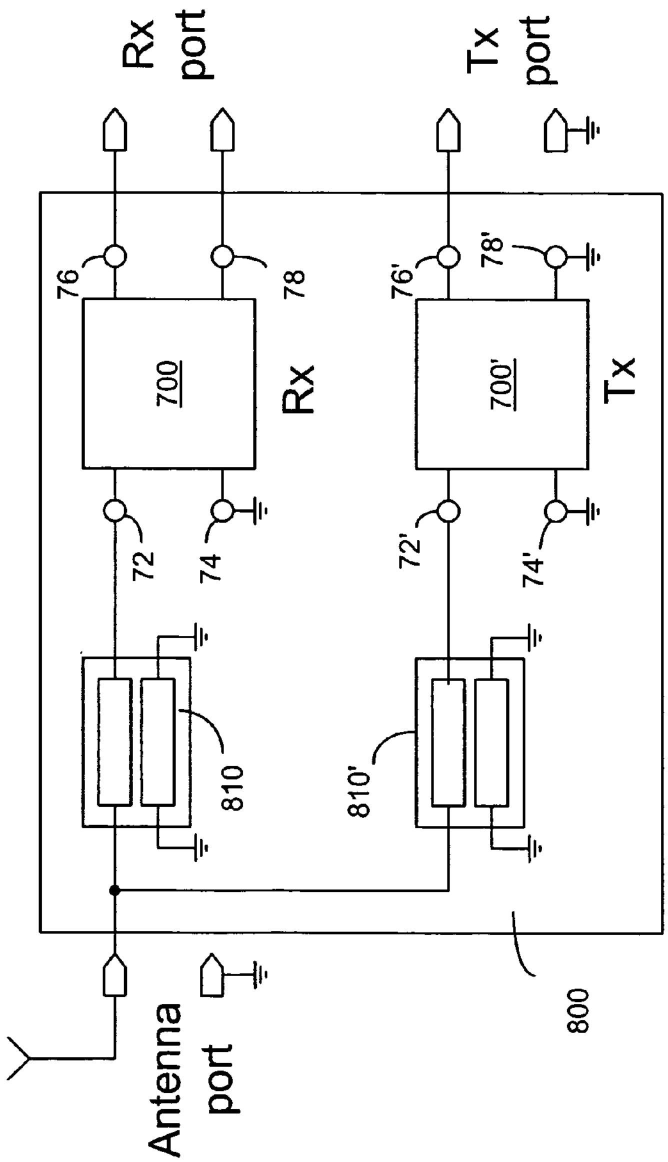
FIG. 12*a* is a block diagram showing a duplexer, according to an embodiment of the present invention.
Figure 12B:
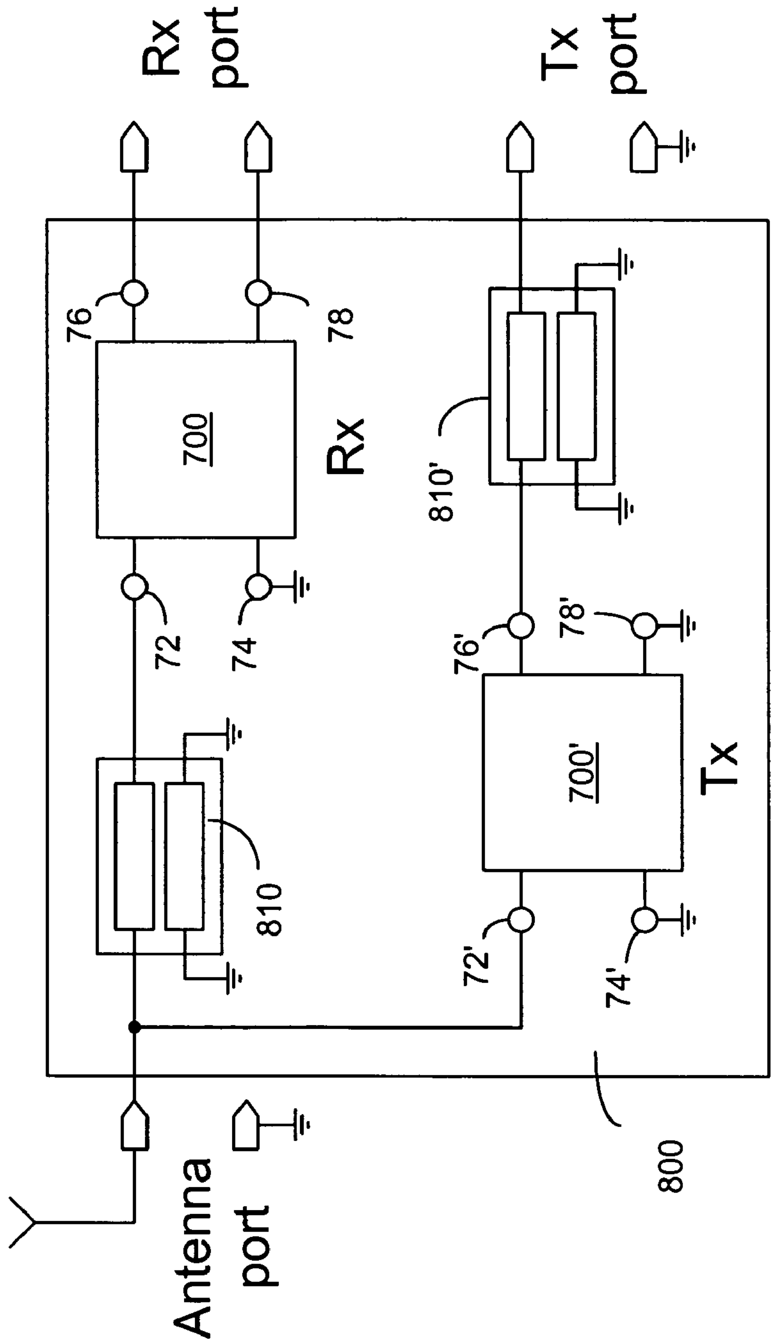
FIG. 12*b* is a block diagram showing the duplexer, according to another embodiment of the present invention.
Figure 12C:
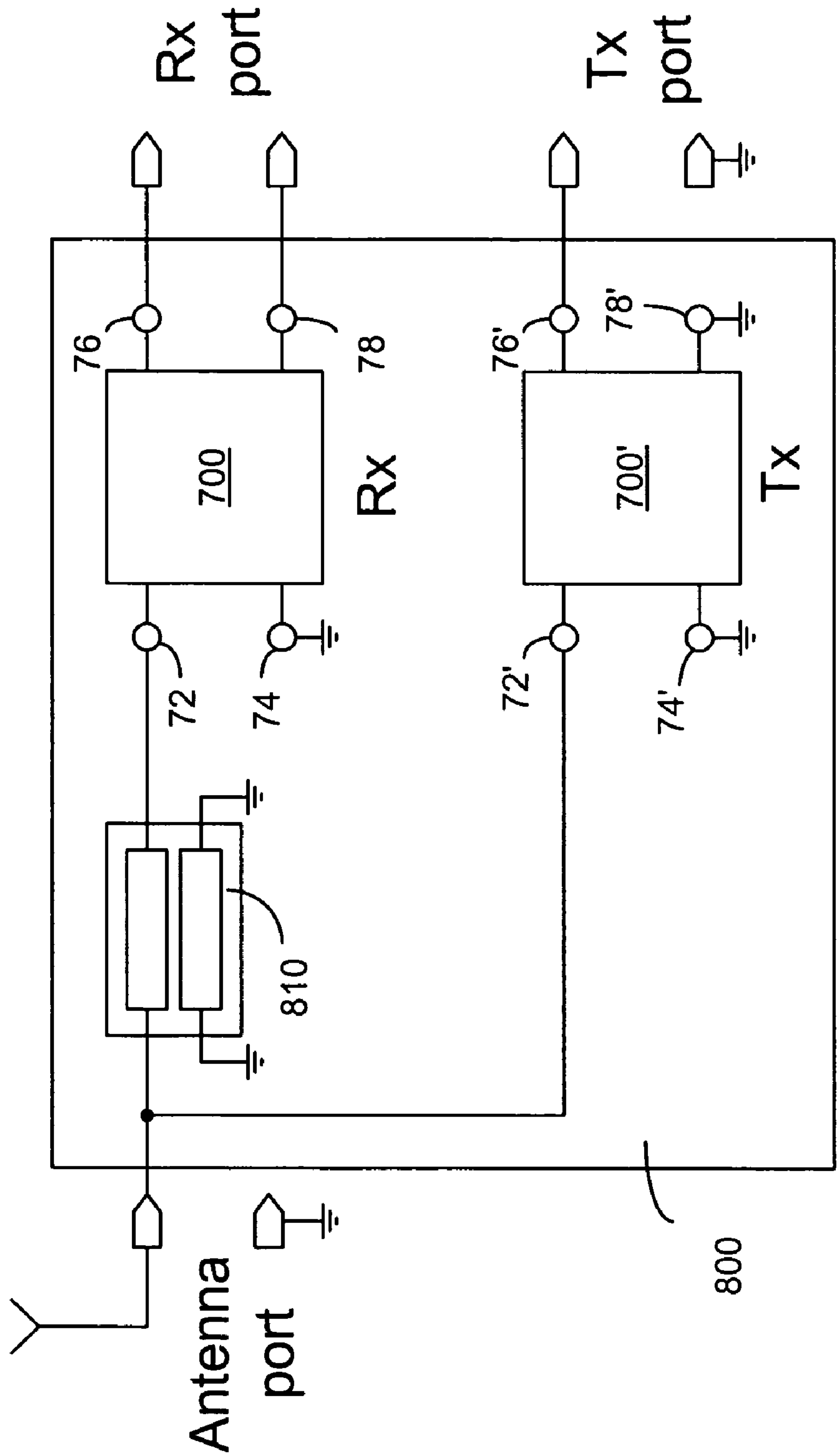
FIG. 12*c* is a block diagram showing the duplexer, according to yet another embodiment of the present invention.

The resonator device 700, according to the present invention, can be used in a duplexer as shown in FIG. 12*a*. As shown, the duplexer 800 comprises a Tx part and an Rx part separately connected to a Tx port and an Rx port, respectively. In the Rx part, the resonator device 700 is used as a single-to-balanced filter in that the terminal 74 is connected to ground. The resonator 700 is connected to a common antenna port through a phase shifter 810. In the Tx part, the resonator device 700' is used as a single-to-single filter in that both the terminal 74' and terminal 78' are connected to ground. The resonator 700' is connected to the common antenna port through a phase shifter 810'. The phase shifters 810 and 810' can be made of transmission lines, lumped elements such as inductors and coils, or the like. The phase shifters 810, 810' can be integrated with the corresponding resonator devices 700, 700' if plausible. Furthermore, the phase shifter 810' can be disposed between the resonator device 700' and the Tx port, as shown in FIG. 12*b*. It is possible to omit the phase shifter 810' in the Tx part, as shown in FIG. 12*c*. Depending on the guard bandwidth between the Tx part and Rx part, the duplexer 800 can be used in a W-CDMA or CDMA transceiver.

Figure 13:
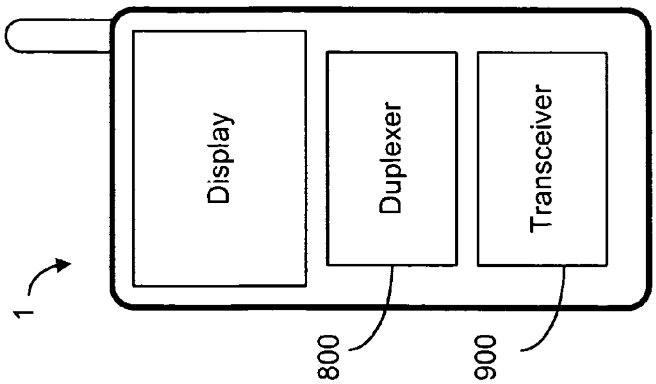
FIG. 13 is a schematic representation showing a communications device having a duplexer, according to the present invention.

The duplexer 800, according to the present invention, can be used in a communications device, such as a mobile phone, as shown in FIG. 13. As shown, the duplexer 800 is operatively connected to the Rx and Tx ports of the transceiver 900 in the communications device 1.

Figure 6:
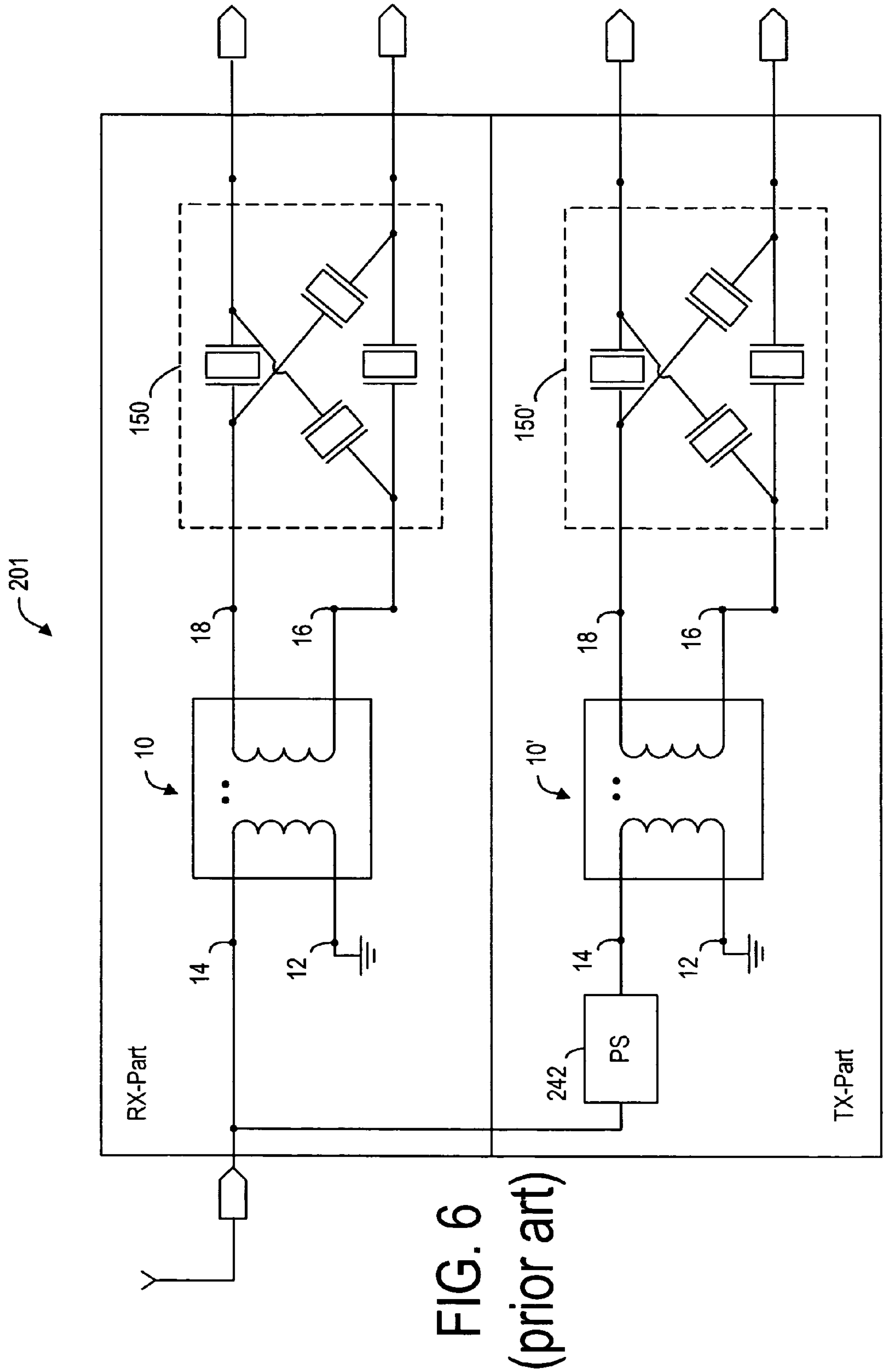
FIG. 6 is a block diagram showing a prior art duplexer wherein each of the transceiver filters has a balun and a lattice filter segment.
Figure 7:
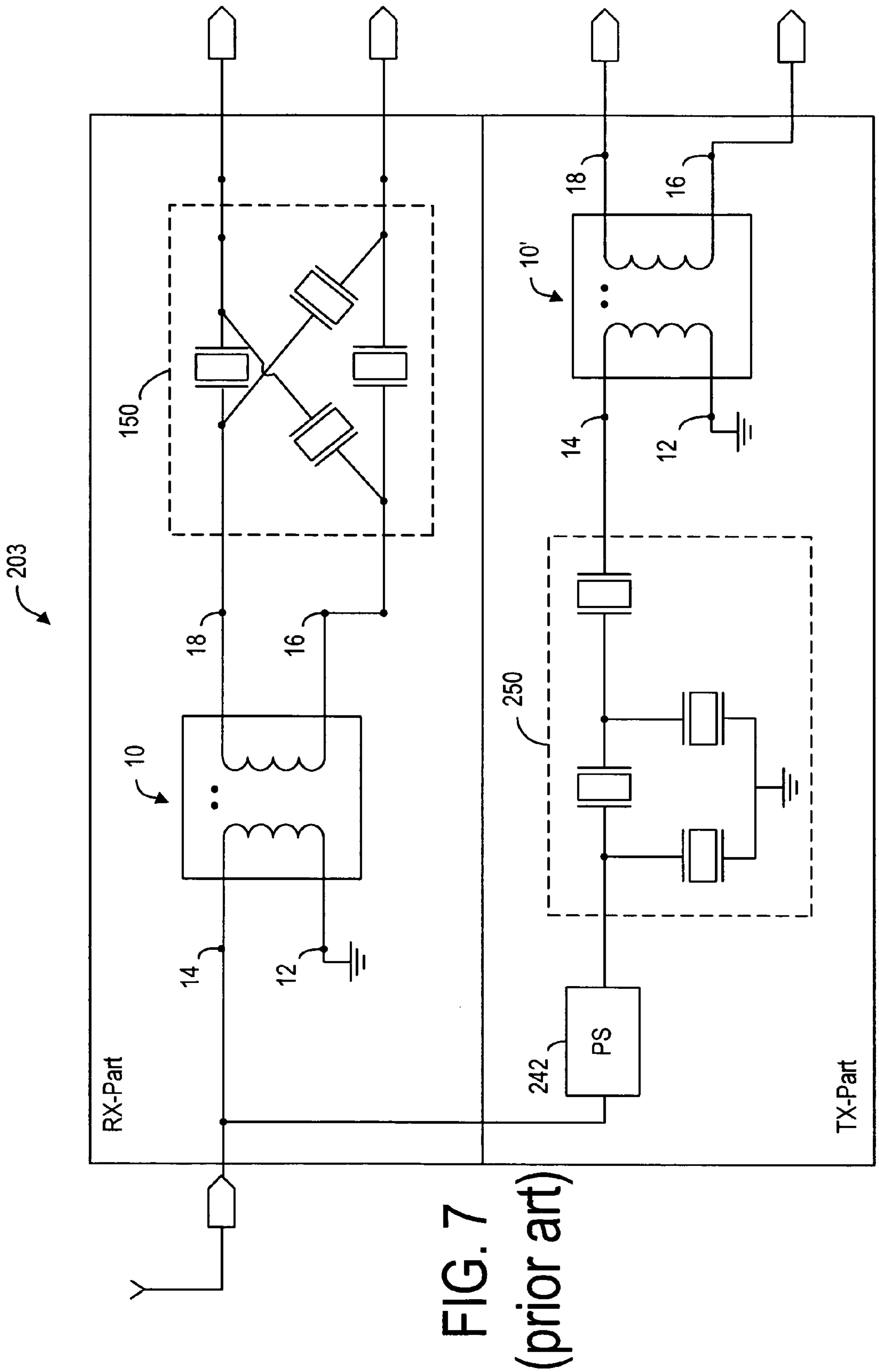
FIG. 7 is a block diagram showing a prior art duplexer, wherein one transceiver filter has a balun coupled to a lattice filter segment, and the other transceiver filter has a balun coupled to a ladder filter.
Figure 8:
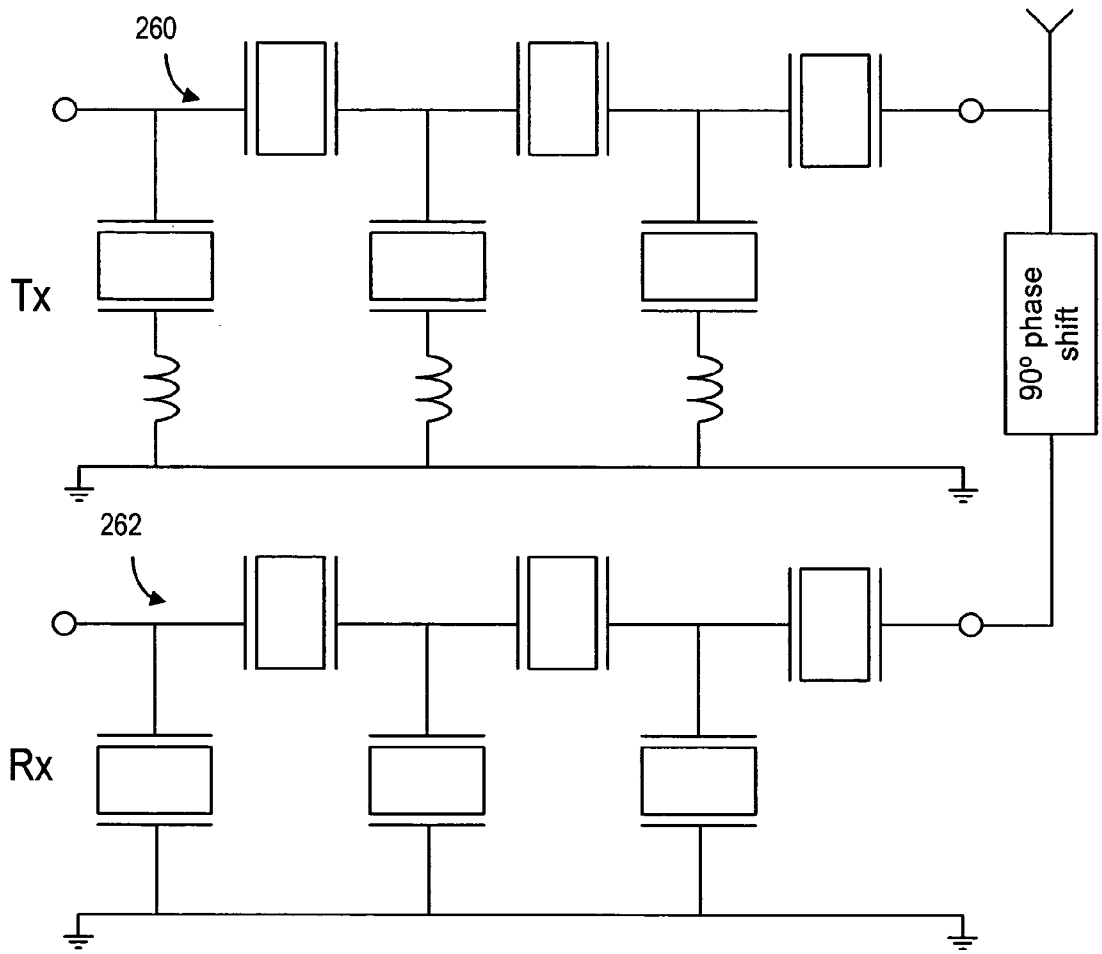
FIG. 8 is a block diagram showing a prior art duplexer with two single-ended filters.
Figure 9:
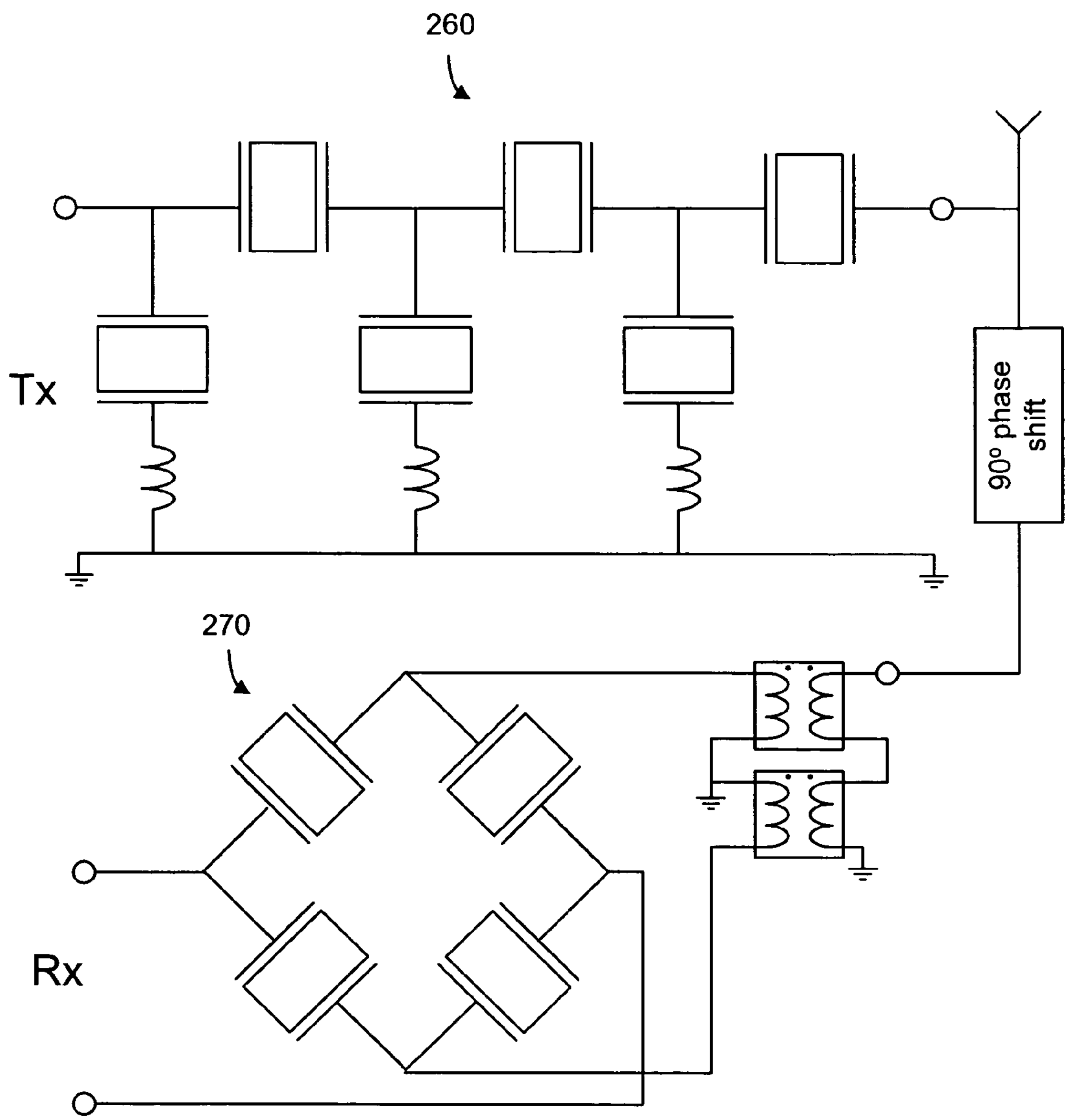
FIG. 9 is a block diagram showing a prior-art duplexer with a single-ended filter and a fully balanced filter.

It should be noted that the resonator device 700 as shown in FIG. 10 has two CRF stages, but can have more than two CRF stages. Similarly, the resonator device 700 in the Rx part and the resonator device 700' can be coupled to other CRF stages or other similar resonator devices, depending on the frequency selectivity requirements of the transceiver. If necessary, one or more phase shifters, similar to the phase shifter 242 in FIGS. 6 and 7, can be used for matching. The phase shifters can be based on lumped elements (such as inductors and coils), or microstrip lines on the duplexer substrate, which may be organic laminate or LTCC (low-temperature cofire ceramic), for example.

The advantages of the duplexer, according to the present invention, include that the out-of-band attenuation far from the passband is greatly improved over the convention duplexers, and that the losses seen at both the Rx and Tx paths are reduced because no magnetic balun is required for the fully balanced Rx part. It should also be noted that impedance level transformation is possible in the duplexer, according to the present invention.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A duplexer for use in a communication device, the communication device having an antenna for conveying communication signals;

a transmit path operatively connected to the antenna for transmitting the signals; and a receive path operatively connected to the antenna for receiving the signals, said duplexer comprising:

a first coupled resonator device disposed in the transmit path for filtering the signals in the transmit path;

a second coupled resonator device disposed in the receive path for filtering the signals in the receive path; and a phase shifter disposed in the receive path and operatively connected to the second coupled resonator device, wherein each of said first and second coupled resonator devices comprises:

an input end for receiving the signals in the corresponding path, and an output end for providing filtered signals in the corresponding path;

a first resonator operatively connected to the input end to provide acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing at the first and second ends electric signals indicative of the delayed acoustic wave signals for generating further acoustic wave signals at the second end;

a second delay section, responsive to the further acoustic wave signals, for providing further delayed acoustic wave signals, the second delay section spaced from the first delay section; and a second resonator operatively connected to the output end, for providing the filtered signals to the output end responsive to the further delayed acoustic wave signals.

2. The duplexer of claim 1, wherein the phase shifter is disposed between the second coupled resonator device and the antenna.

3. The duplexer of claim 2, further comprising a further phase shifter disposed in the transmit path and operatively connected to the first coupled resonator device.

4. The duplexer of claim 3, wherein the further phase shifter is disposed between the first coupled resonator device and the antenna.

5. The duplexer of claim 3, wherein the first coupled resonator device is disposed between the further phase shifter and the antenna.

6. The duplexer of claim 3, wherein each of the phase shifter and the further phase shifter comprises a transmission line.

7. The duplexer of claim 3, wherein each of the phase shifter and the further phase shifter comprises one or more lumped elements.

8. The duplexer of claim 3, wherein the further phase shifter comprises one or more lumped elements integrated with the first coupled resonator device.

9. The duplexer of claim 1, wherein the first and second resonators are bulk acoustic wave devices.

10. The duplexer of claim 1, wherein the input end of the first coupled resonator device comprises two input terminals, and the output end of the first coupled resonator device comprises two output terminals, and wherein one of the two input terminals and one of the two output terminals are operatively connected to ground.

11. The duplexer of claim 1, wherein the input end of the second coupled resonator device comprises two input terminals, and wherein one of the two input terminals is operatively connected to ground to achieve a single-to-balanced transformation.

12. The duplexer of claim 11, wherein the input end of the first coupled resonator device comprises two input terminals, and the output end of the first coupled resonator device comprises two output terminals, and wherein one of the two input terminals and one of the two output terminals are operatively connected to ground.

13. A coupled resonator device, comprising:

an input end for receiving the signals in the corresponding path, and an output end for providing filtered signals in the corresponding path;

a first resonator, operatively connected to the input end to provide acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing electric signals at the first and second ends indicative of the delayed acoustic wave signals for generating further acoustic wave signals at the second end;

a second delay section, responsive to the further acoustic wave signals, for providing further delayed acoustic wave signals, the second delay section spaced from the first delay section; and a second resonator, operatively connected to the output end, for providing the filtered signals to the output end responsive to the further delayed acoustic wave signals.

14. The resonator device of claim 13, further comprising a substrate, wherein the intermediate resonator comprises:

a first electrode disposed on the substrate;

a piezoelectric layer disposed on the first electrode; and a second electrode disposed on the piezoelectric layer, the second electrode having a first end and a second end, and wherein the first delay section is disposed on the first end of the second electrode;

the second delay section is disposed on the second end of the second electrode;

the first resonator is disposed on the first delay section; and the second resonator is disposed on the second delay section.

15. The resonator device of claim 14, further comprising an acoustic mirror disposed adjacent to the intermediate resonator, between the first electrode and the substrate.

16. The resonator device of claim 13, wherein each of the first and second resonators comprises a pair of electrodes and a further piezoelectric layer disposed between said pair of electrodes.

17. The resonator device of claim 13, wherein each of the first and second delay sections comprises a plurality of dielectric materials.

18. The resonator device of claim 13, wherein each of the first and second delay sections comprises a structure composed of silicon dioxide and tungsten layers.

19. The resonator device of claim 13, wherein the input end comprises two input terminals, and wherein one of the two input terminals is operatively connected to a non-acoustic phase shifting component.

20. The resonator device of claim 19, wherein the other of the two input terminals is operatively connected to ground.

21. The resonator device of claim 13, wherein the first resonator has a first resonant frequency and the second resonator has a second resonant frequency slightly different from the first resonant frequency.

22. A communication device comprising:

an antenna port for conveying communication signals;

a transceiver having a transmit port and a receive port; and a duplexer comprising:

a first coupled resonator device disposed in a transmit path between the antenna port and the transmit port for filtering the signals in the transmit path;

a second coupled resonator device disposed in the receive path between the antenna port and the receive port for filtering the signals in the receive path; and a phase shifter disposed in the receive path and operatively connected to the second coupled resonator device, wherein each of said first and second coupled resonator devices comprises:

an input end for receiving the signals in the corresponding path; and an output end for providing filtered signals in the corresponding path;

a first resonator, operatively connected to the input end, for providing acoustic wave signals indicative of the received signals;

a first delay section, responsive to the acoustic wave signals, for providing delayed acoustic wave signals;

an intermediate resonator having a first end and a second end, responsive to the delayed acoustic wave signals at the first end, for producing an electric signals at the first and second ends indicative of the delayed acoustic wave signals for generating further acoustic wave signals at the second end;

a second delay section, responsive to the further acoustic wave signals, for providing further delayed acoustic wave signals, the second delay section spaced from the first delay section; and a second resonator operatively connected to the output end, for providing the filtered signals to the output end responsive to the further delayed acoustic wave signals.

23. The communication device of claim 22, wherein the duplexer further comprises:

a further phase shifter disposed in the transmit path and operatively connected to the first coupled resonator device.

24. The communication device of claim 22, comprising a mobile terminal.

25. The communication device of claim 22, wherein each of the first and second delay sections in the first and second coupled devices comprises a structure composed of silicon dioxide and tungsten layers.

26. The communication device of claim 22, wherein the first coupled resonator device has a single-to-single configuration and the second coupled resonator device has a single-to-balanced transformation.

* * * * *